United States Patent
Luan (10) Patent No.: US 9,583,666 B2
(45) Date of Patent: Feb. 28, 2017

(54) WAFER LEVEL PACKAGING FOR PROXIMITY SENSOR

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/668,309

(22) Filed: Mar. 25, 2015

(65) Prior Publication Data

US 2016/0190380 A1    Jun. 30, 2016

(30) Foreign Application Priority Data

Dec. 25, 2014    (CN) .......................... 2014 1 08332679

(51) Int. Cl.

| | |
|---|---|
| H01L 31/16 | (2006.01) |
| H01L 25/16 | (2006.01) |
| H01L 31/02 | (2006.01) |
| H01L 31/0232 | (2014.01) |
| G01S 17/02 | (2006.01) |
| G01S 7/481 | (2006.01) |

(52) U.S. Cl.
CPC ............ H01L 31/16 (2013.01); G01S 7/4813 (2013.01); G01S 17/026 (2013.01); H01L 25/167 (2013.01); H01L 31/02002 (2013.01); H01L 31/02325 (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/92227* (2013.01); *H01L 2224/97* (2013.01); *H01L 2924/15192* (2013.01); *H01L 2924/15311* (2013.01); *H01L 2924/181* (2013.01)

(58) Field of Classification Search
CPC ................... H01L 31/16; H01L 25/167; H01L 2224/73265; H01L 2224/92227; H01L 2224/97; H01L 2924/181; G01S 17/026
See application file for complete search history.

(56) References Cited

U.S. PATENT DOCUMENTS

2015/0262983 A1*    9/2015  Krabe ................... H01L 25/167
                                                                250/214.1

* cited by examiner

*Primary Examiner* — Armando Rodriguez
(74) *Attorney, Agent, or Firm* — Seed Intellectual Property Law Group LLP (57) ABSTRACT

A proximity sensor includes a semiconductor die, a light emitting assembly, a redistribution layer, and an encapsulating layer. A surface of the semiconductor die includes a sensor area and contact pads. A lens is positioned over the sensor area of the semiconductor die. The light emitting assembly includes a light emitting device having a light emitting area, a lens positioned over the light emitting area, and contact pads that face the redistribution layer. A side of the redistribution layer includes contact pads. Electrical connectors place each of the contact pads of the semiconductor die in electrical communication with a respective one of the contact pads of the redistribution layer. The encapsulating layer is positioned on the redistribution layer and at least partially encapsulates the semiconductor die, the lens over the sensor area of the semiconductor die, and the light emitting assembly.

21 Claims, 10 Drawing Sheets

WAFER LEVEL PACKAGING FOR PROXIMITY SENSOR

BACKGROUND

Technical Field

The present application generally relates to semiconductor devices, and more particularly to semiconductor proximity sensor devices.

Description of the Related Art

Figure 1A:
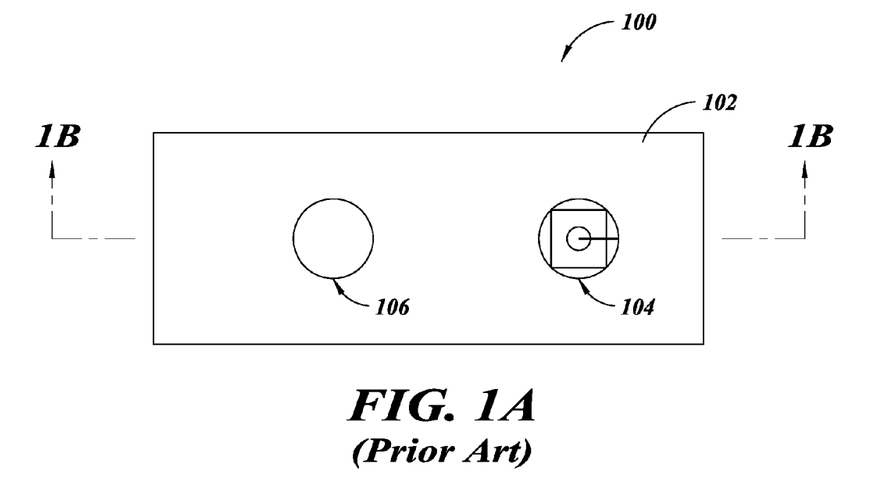
FIG. 1A is a top plan view of a conventional proximity sensor.
Figure 1B:
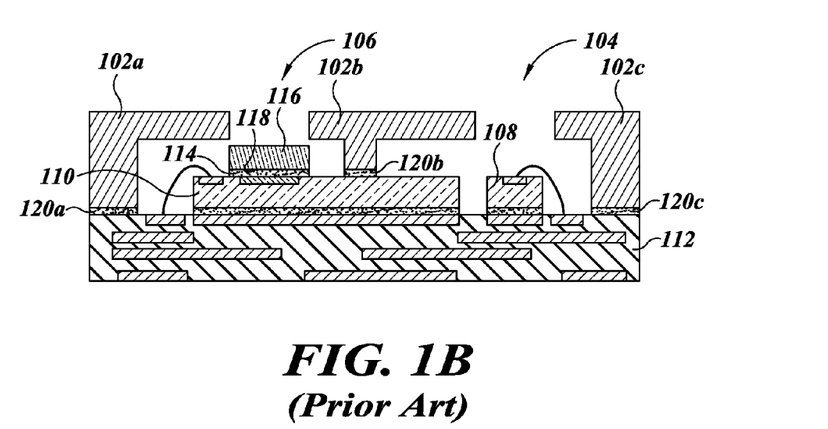
FIG. 1B is a cross-sectional view of the proximity sensor shown in FIG. 1A.

FIG. 1A is a top plan view of a conventional proximity sensor 100. The proximity sensor 100 includes a cap 102 having a first aperture 104 and a second aperture 106 formed therein. FIG. 1B is a cross-sectional view of the proximity sensor 100 along the line IB-IB shown in FIG. 1A. The proximity sensor 100 includes a light emitting device 108 and a semiconductor die 110 disposed on a printed circuit board substrate 112. A sensor area 114 is disposed on an upper surface of the semiconductor die 110. A lens 116 is secured to the semiconductor die 110 above the sensor area 114 using a transparent adhesive material 118. The light emitting device 108 emits light through the first aperture 104. The light emitted by the light emitting device 108 that is reflected by an object in the vicinity of the proximity sensor 100 may enter the second aperture 106, travel through the lens 116, and impact the sensor area 114. The proximity sensor 100 outputs a signal indicative of the intensity of light that is incident on the sensor area 114.

As shown in FIG. 1B, the cap 102 includes a first cap piece 102a, a second cap piece 102b, and a third cap piece 102c. The cap pieces 102a-102c are extremely small, generally having dimensions between 15 micrometers and 150 micrometers. The first cap piece 102a is secured to the printed circuit board substrate 112 using an adhesive material 120a. The second cap piece 102b is secured to the semiconductor die 110 using an adhesive material 120b. The third cap piece 102c is secured to the printed circuit board substrate 112 using an adhesive material 120c.

During fabrication of the proximity sensor 100, the adhesive material 120a and the adhesive material 120c are deposited on an upper surface of the printed circuit board substrate 112, and the adhesive material 120b is deposited on an upper surface of the semiconductor die 110. The tiny cap pieces 102a-102c are carefully positioned on the adhesive materials 120a-120c, respectively. If the cap pieces 102a-102c and/or the adhesive materials 120a-120c are not precisely placed in their intended locations, the cap pieces 102a-102c may not adhere properly and/or may not form the apertures 104 and 106 over the light emitting device 108 and the sensor area 114, respectively. Thus, fabrication of the proximity sensor 100 may result in a high defect rate, which can increase manufacturing costs.

Accordingly, proximity sensor devices that can be fabricated with lower defect rates are needed.

BRIEF SUMMARY

According to an embodiment, a method of fabricating a proximity sensor is provided. According to the method, a semiconductor die is placed on a first adhesion layer. A first side of the semiconductor die includes a sensor area and faces away from the first adhesion layer. A first lens is placed over the sensor area of the semiconductor die. A light emitting assembly is placed over the first adhesion layer. The light emitting assembly includes a light emitting device having a light emitting area and a second lens positioned over the light emitting area. The light emitting area faces away from the first adhesion layer. An encapsulating layer is formed at least partially on the semiconductor die, the first lens, and the light emitting assembly to form a proximity sensor assembly having a first side, wherein the first side faces away from the first adhesion layer. The proximity sensor assembly is separated from the first adhesion layer. The proximity sensor assembly is placed on a second adhesion layer such that the first side of proximity sensor assembly faces the second adhesion layer. A redistribution layer is formed on a second side of the proximity sensor assembly.

According to another embodiment, a proximity sensor is provided. The proximity sensor includes a semiconductor die, a redistribution layer, a first plurality of electrical connectors, a first lens, a light emitting assembly, and an encapsulating layer. A first surface of the semiconductor die includes a sensor area and a first plurality of contact pads. The first lens is positioned over the sensor area of the semiconductor die. The redistribution layer overlies the semiconductor die and includes a first side having a second plurality of contact pads. Each of the first plurality of contact pads of the semiconductor die is in electrical communication with a respective one of the second plurality of contact pads of the redistribution layer. The light emitting assembly includes a light emitting device having a light emitting area, a second lens positioned over the light emitting area, and a third plurality of contact pads facing the redistribution layer. An encapsulating layer is positioned on the redistribution layer and at least partially encapsulates the semiconductor die, the first lens, and the light emitting assembly.

DETAILED DESCRIPTION

Figure 2A:
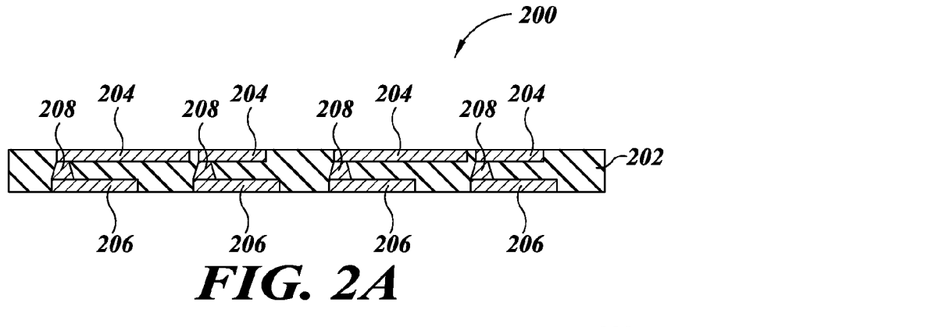
FIGS. 2A-2E show a semiconductor assembly at various stages of fabrication, according to one embodiment.

FIGS. 2A-2E show a semiconductor assembly 200 at various stages of fabrication, according to one embodiment. As shown in FIG. 2A, the semiconductor assembly 200 includes a printed circuit board substrate 202. An upper surface of the printed circuit board substrate 202 includes a plurality of contact pads 204. A lower surface of the printed circuit board substrate 202 includes a plurality of contact pads 206. A plurality conductive traces 208 form electrical connections between one or more of the contact pads 204 on the upper surface of the printed circuit board substrate 202 and one or more of the contact pads 206 on the lower surface of the printed circuit board substrate 202.

Figure 2B:
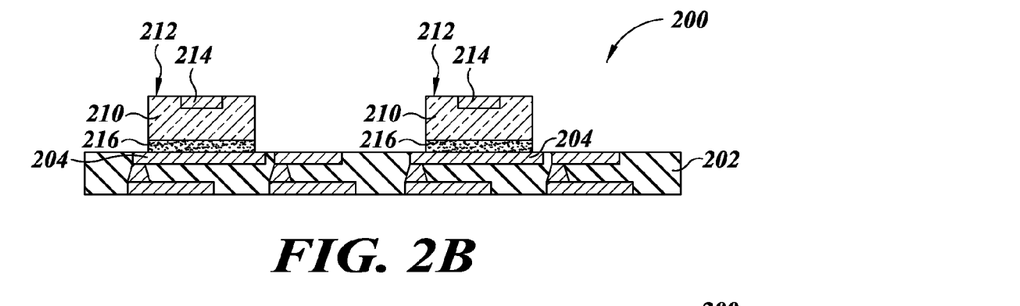

As shown in FIG. 2B, a plurality of conventional light emitting devices 210 is placed over the upper surface of the printed circuit board substrate 202. In one embodiment, each of the light emitting devices 210 is a conventional light emitting diode (LED). In one embodiment, each of the light emitting devices 210 is a conventional vertical-cavity surface-emitting laser (VCSEL).

An upper surface of each light emitting device 210 includes a light emitting area 212 and a contact pad 214. A conventional conductive adhesive material 216 forms an electrical connection between a lower surface of each light emitting device 210 and one of the contact pads 204 on the upper surface of the printed circuit board substrate 202. The conductive adhesive material 216 secures each light emitting device 210 to the upper surface of the printed circuit board substrate 202.

In one embodiment, the conductive adhesive material 216 is formed on predetermined ones of the contact pads 204 on the upper surface of the printed circuit board substrate 202 and then the lower surfaces of the light emitting devices 210 are placed in contact with the conductive adhesive material 216. In one embodiment, at least part of the lower surface of each of the light emitting devices 210 is coated with the conductive adhesive material 216, which is then placed in contact with a predetermined one of the contact pads 204 on the upper surface of the printed circuit board substrate 202. For example, pick-and-place machinery employing conventional surface mount technology may be used to place the light emitting devices 210 on the upper surface of the printed circuit board substrate 202.

Figure 2C:
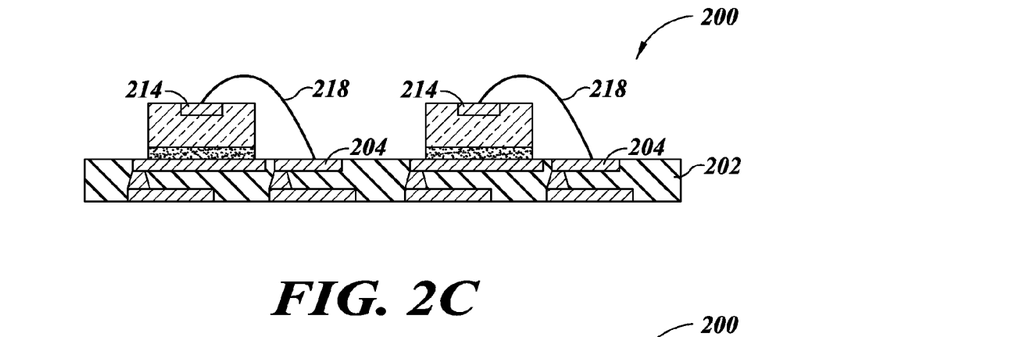

As shown in FIG. 2C, electrical connections are then formed between the contact pads 214 on the upper surfaces of the light emitting devices 210 and corresponding contact pads 204 on the upper surface of the printed circuit board substrate 202. In one embodiment, conventional wire bonding machinery connects one end of each of a plurality of wires 218 to one of the contact pads 204 on the upper surface of the printed circuit board substrate 202 and then connects the other end of the wire 218 to one of the contact pads 214 on the upper surface of a respective one of the light emitting devices 210.

Figure 2D:
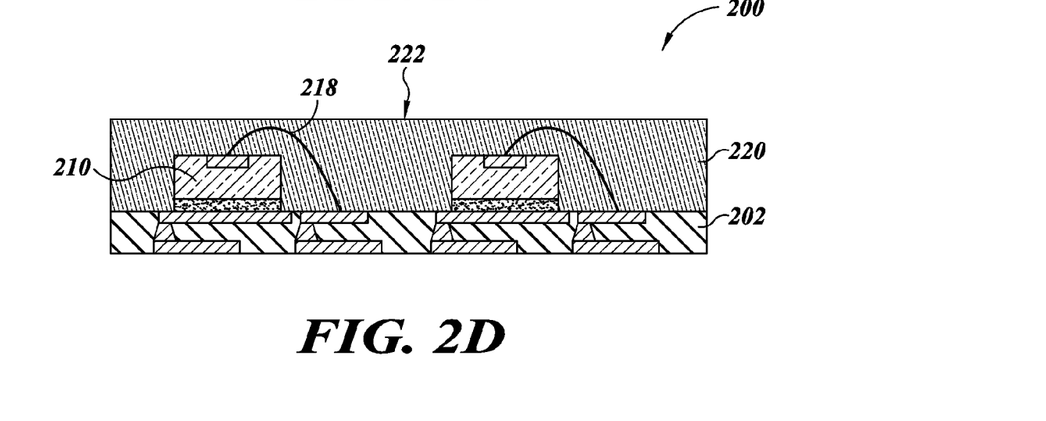

As shown in FIG. 2D, a layer of a conventional transparent material 220 is then formed on the upper surface of the printed circuit board substrate 202 and upper and side surfaces of each of the light emitting devices 210 and the wires 218. Initially, the transparent material 220 may be in a liquid or gel form and may be poured or injected over the printed circuit board substrate 202, the light emitting devices 210, and the wires 218. The transparent material 220 may then be cured with UV light, heat, and/or moisture to cause the transparent material 220 to take a solid form more quickly.

The transparent material 220 may enable most, if not all, of the light incident on the transparent material 220 to pass therethrough. For example, the transparent material 220 may enable at least 85% of the light in the visible spectrum (e.g., wavelengths of light from approximately 400 nanometers to 700 nanometers) or light in the infrared spectrum (e.g., wavelengths of light from approximately 700 nanometers to 1250 nanometers) that is incident on the transparent material 220 to pass therethrough. Additionally or alternatively, the transparent material 220 may act as a filter that prevents predetermined wavelengths of light from passing therethrough. For example, the transparent material 220 may prevent light in the visible spectrum or light in the infrared spectrum that is incident on the transparent material 220 from passing therethrough.

Figure 2E:
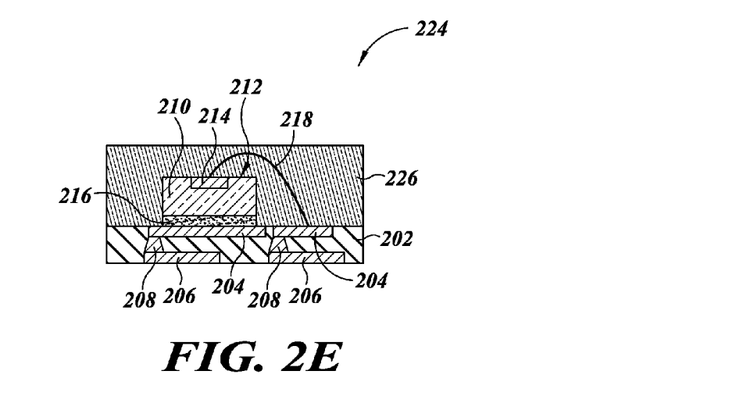

With reference to FIGS. 2D and 2E, the semiconductor assembly 200 is then sawed or otherwise separated to form a plurality of light emitting assemblies 224. For example, the blade of a saw is placed on the upper surface of the semiconductor assembly 200 at the location 222 and then moved downwardly until the blade passes through the layer of the transparent material 220 and the printed circuit board substrate 202.

Figure 3A:
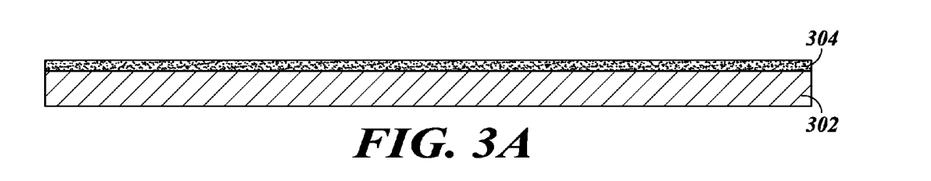
FIGS. 3A-3L show a semiconductor assembly at various stages of fabrication, according to one embodiment.

FIGS. 3A-3L show a semiconductor assembly 300 at various stages of fabrication, according to an embodiment. As shown in FIG. 3A, the semiconductor assembly 300 initially includes a first carrier 302 on which a first adhesion layer 304 is formed. For example, the first carrier 302 is a silicon carrier and the first adhesion layer 304 is formed from a conventional adhesive material.

Figure 3B:
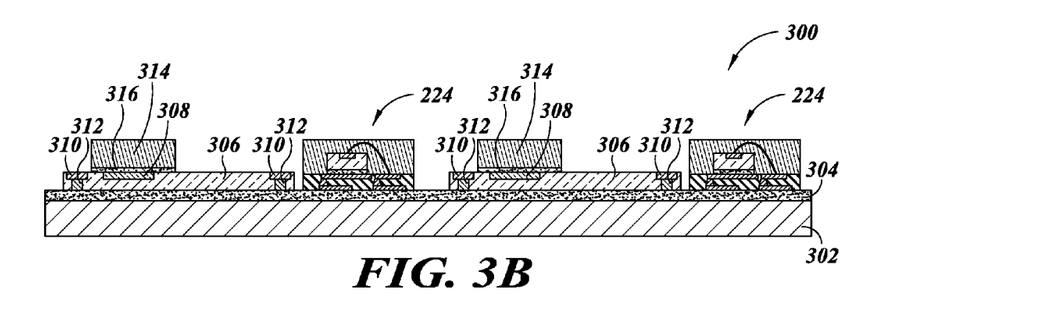

As shown in FIG. 3B, a plurality of components is placed on an upper surface of the first adhesion layer 304, wherein the upper surface of the first adhesion layer 304 faces away from the first carrier 302. More particularly, a plurality of conventional semiconductor dice 306 is placed on the upper surface of the first adhesion layer 304. For example, pick-and-place machinery employing conventional surface mount technology may be used to place the semiconductor dice 306 on the upper surface of the first adhesion layer 304. An upper surface of each semiconductor die 306 includes a sensor area 308 and a plurality of contact pads 310. Each of a plurality of electrical connectors 312 is in electrical communication with one of the contact pads 310 and extends from the contact pad 310 to a lower surface of one of the semiconductor dice 306.

Additionally, a plurality of conventional lenses 314 is placed over the upper surfaces of the semiconductor dice 306. Each lens 314 is secured to one of the semiconductor dice 306 using a conventional transparent adhesive material 316. The transparent adhesive material 316 may be placed on a lower surface of each lens 314, which is then placed on the upper surface of one of the semiconductor dice 306 such that the lens 314 covers the sensor area 308 of the semiconductor die 306. Additionally or alternatively, the transparent adhesive material 316 may be placed on the upper surfaces of the semiconductor dice 306 in the vicinity of the sensor areas 308, and then the lenses 314 are placed onto the transparent adhesive material 314 to secure the lenses 314 to the semiconductor dice 306 over the sensor areas 308. For example, pick-and-place machinery employing conventional surface mount technology may be used to place the lenses 314 on the upper surfaces of the semiconductor dice 306.

Each of the lenses 314 and/or the transparent adhesive material 316 may enable most, if not all, of the light incident thereon to pass therethrough. For example, the lenses 314 and/or the transparent adhesive material 316 may enable at least 85% of the light in the visible spectrum or light in the infrared spectrum that is incident thereon to pass therethrough. Additionally or alternatively, the lenses 314 and/or the transparent adhesive material 316 may act as a filter that prevents predetermined wavelengths of light from passing therethrough. For example, the lenses 314 and/or the transparent adhesive material 316 may prevent light in the visible spectrum or light in the infrared spectrum that is incident thereon from passing therethrough.

In addition, a plurality of the light emitting assemblies 224 is placed over the first adhesion layer 304. In the embodiment shown in FIG. 3B, each light emitting assembly 224 is placed onto the first adhesion layer 304. For example, pick-and-place machinery employing conventional surface mount technology may be used to place the light emitting assemblies 224 on the upper surface of the first adhesion layer 304.

Figure 3C:
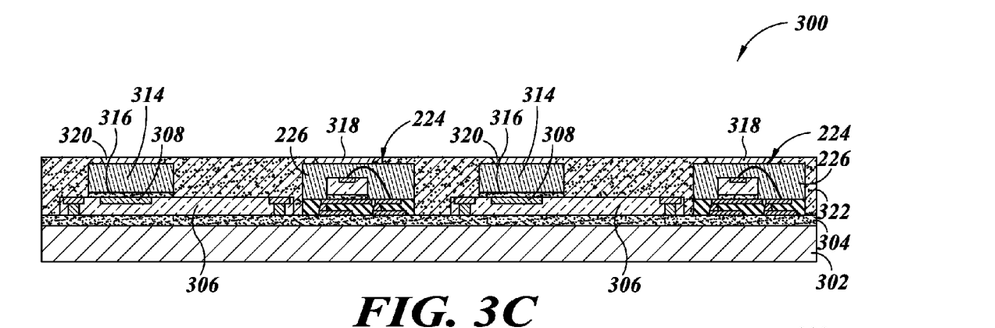

As shown in FIG. 3C, a plurality of masks 318 is positioned over the lenses 226 of the light emitting assemblies 224. In addition, a plurality of masks 320 is positioned over the lenses 314 that are disposed over the sensor areas 308 of the semiconductor dice 306. In one embodiment, an adhesive material (not shown) secures the masks 318 to the lenses 226 of the light emitting assemblies 224 and also secures the masks 320 to the lenses 314.

An encapsulating layer 322 is then formed on exposed portions of the upper surface of the first adhesion layer 304 and portions of the upper and side surfaces of each semiconductor die 306, each lens 314, and each light emitting assembly 224. The encapsulating layer 322 is formed from a conventional molding compound that does not transmit light therethrough. For example, the encapsulating layer 322 may be formed from a black material.

Initially, the encapsulating layer 322 may be in a liquid or gel form that is poured or injected over the first adhesion layer 304, the semiconductor dice 306, the lenses 314, and the light emitting assemblies 224. The encapsulating layer 322 may then be cured with UV light, heat, and/or moisture to cause the encapsulating layer 322 to take a solid form more quickly. Preferably, the temperature at which the molding compound forming the encapsulating layer 322 transitions from a solid form to a liquid or gel form is lower than the temperature at which the transparent material 220 forming the lenses 226 of the light emitting assemblies 224 transitions from a solid form to a liquid or gel form. Thus, the encapsulating layer 322 may be in a liquid or gel form while the transparent material 220 forming the lenses 226 of the light emitting assemblies 224 remains in a solid form.

Figure 3D:
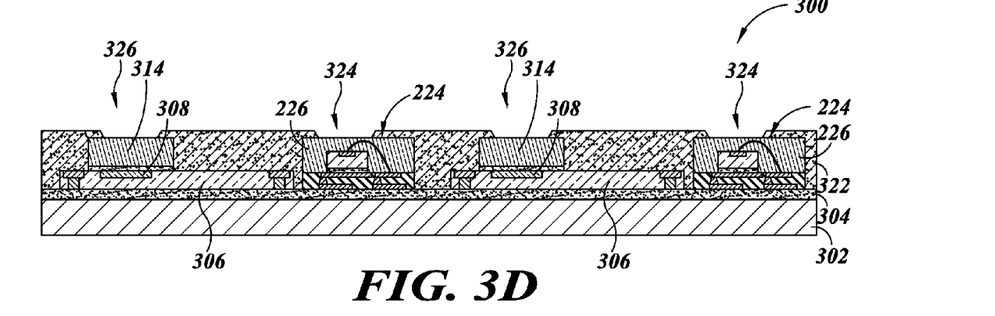

The masks 318 and the masks 320 are then removed from the lenses 226 of the light emitting assemblies 224 and the lenses 314 over the sensor areas 308 of the semiconductor dice 306. When the masks 318 and the masks 320 are removed, first apertures 324 are formed over the lenses 226 of the light emitting assemblies 224 and second apertures 326 are formed over the lenses 314 over the sensor areas 308 of the semiconductor dice 306. In one embodiment, blades are used to scrape or otherwise remove portions of the encapsulating layer 322 from the upper surfaces of the lenses 226 of the light emitting assemblies 224 and the lenses 314 over the sensor areas 308 of the semiconductor dice 306 to form the first apertures 324 and the second apertures 326, respectively.

In one embodiment, the masks 318 and the masks 320 are projections that extend downwardly from an upper surface of a cavity included in film-assisted molding machinery. The semiconductor assembly 300 is then placed in the cavity and raised toward the upper surface of the cavity until the masks 318 and the masks 320 contact the upper surfaces of the lenses 226 of the light emitting assemblies 224 and the lenses 314 over the sensor areas 308 of the semiconductor dice 306, respectively. While the machinery holds the semiconductor assembly 300 in this position, the machinery injects the molding compound that forms the encapsulating layer 322 into the cavity. After the molding compound has at least partially hardened, the machinery moves the semiconductor assembly 300 away from the upper surface of the cavity until the masks 318 and the masks 320 no longer contact the lenses 226 of the light emitting assemblies 224 and the lenses 314 over the sensor areas 308 of the semiconductor dice 306, respectively.

The first carrier 302 and the first adhesion layer 304 are then separated from the lower surfaces of the semiconductor dice 306, the light emitting assemblies 224, and the encapsulating layer 322. A solvent such as water, for example, may be used to cause the first adhesion layer 304 to separate from the lower surfaces of the semiconductor dice 306, the light emitting assemblies 224, and the encapsulating layer 322.

Figure 3E:
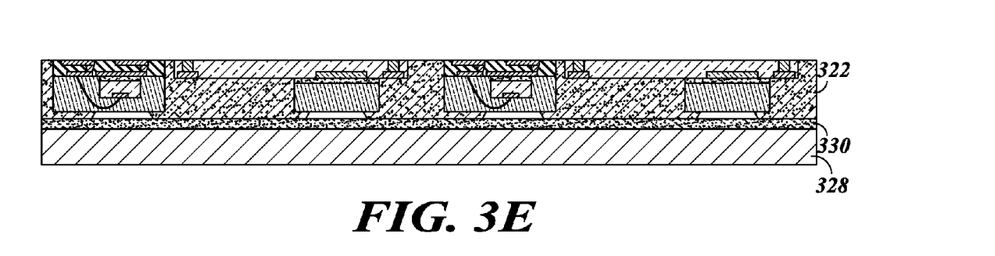

As shown in FIG. 3E, the semiconductor assembly 300 is then flipped over and mounted to a second carrier 328. A second adhesion layer 330 is formed on an upper surface of the second carrier 328. For example, the second carrier 328 is a silicon carrier and the second adhesion layer 330 is formed from a conventional adhesive material. The encapsulating layer 322 is placed onto the second adhesion layer 330 to secure the semiconductor assembly 300 to the second carrier 328.

Figure 3F:
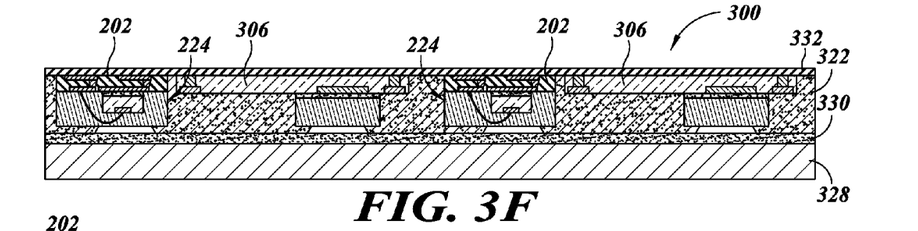

As shown in FIG. 3F, a first dielectric layer 332 is formed over the upper surface of the semiconductor assembly 300. More particularly, the first dielectric layer 332 is formed over the lower surfaces of the semiconductor dice 306, the printed circuit board substrates 202 of the light emitting assemblies 224, and the encapsulating layer 322. The first dielectric layer 332 is formed from a conventional dielectric material.

Figure 3G:
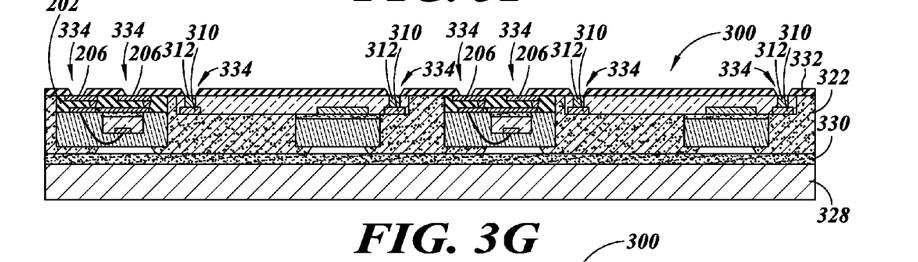

As shown in FIG. 3G, a plurality of openings 334 is formed in the first dielectric layer 332. The openings 334 are formed over the contact pads 206 on the lower surface of the printed circuit board substrate 202 of the light emitting assemblies 224 and over each of the electrical connectors 312 extending through the semiconductor dice 306. The opening 334 are formed using conventional semiconductor fabrications techniques.

Figure 3H:
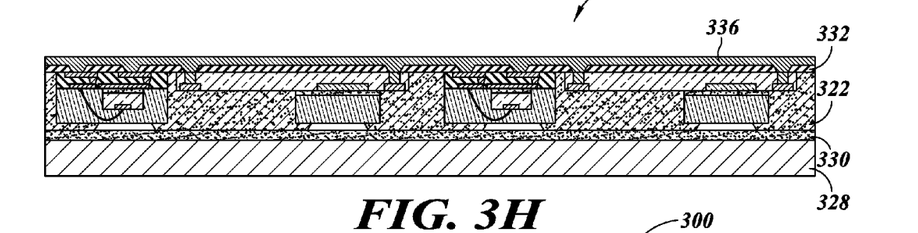

As shown in FIG. 3H, a conductive layer 336 is formed over the first dielectric layer 332 and the openings 334. The conductive layer 336 may be formed from copper, for example, or another conventional electrically conductive material.

Figure 3I:
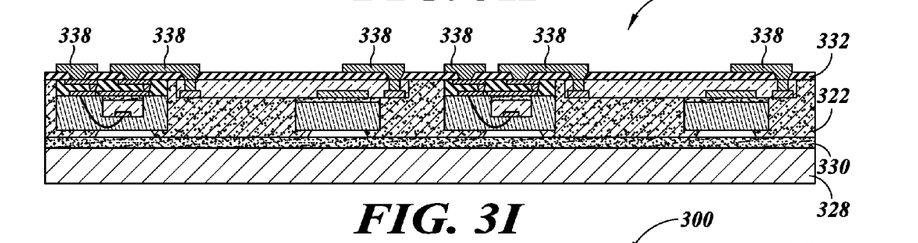

As shown in FIG. 3I, portions of the conductive layer 336 are removed leaving a plurality of contact pads 338. The portions of the conductive layer 336 are removed using conventional semiconductor fabrications techniques.

Figure 3J:
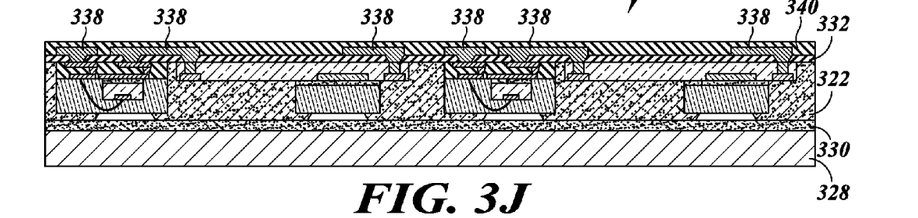

As shown in FIG. 3J, a second dielectric layer 340 is formed over exposed portions of the first dielectric layer 332 and the contact pads 338. The second dielectric layer 340 may be formed from the same or a different conventional dielectric material from which the first dielectric layer 332 is formed.

Figure 3K:
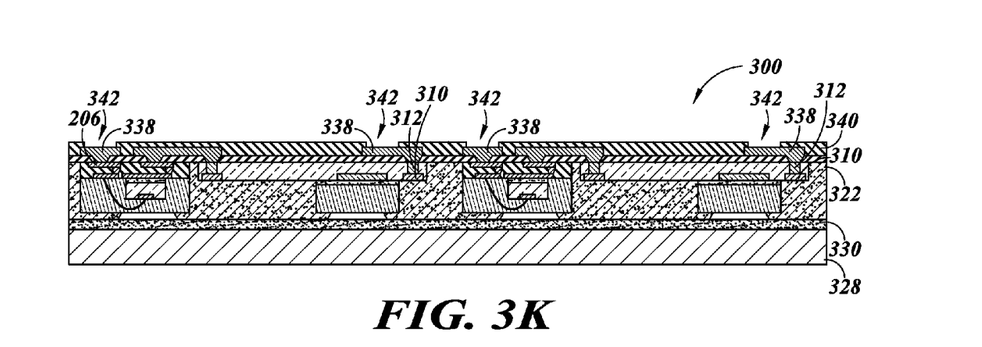

As shown in FIG. 3K, a plurality of openings 342 is formed in the second dielectric layer 340. The openings 342 are formed over predetermined ones of the contact pads 338 to at least partially expose those contact pads 328. The opening 342 are formed using conventional semiconductor fabrications techniques.

Figure 3L:
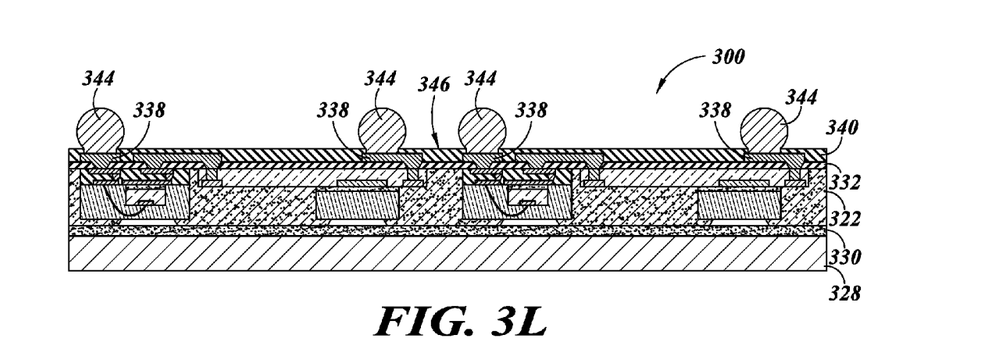

As shown in FIG. 3L, a plurality of conductive solder bumps 344 is formed on the semiconductor assembly 300. Each solder bump 344 is formed on one of the exposed contact pads 338. The solder bumps 344 are formed from conventional soldering materials using conventional semiconductor fabrications techniques.

Figure 4A:
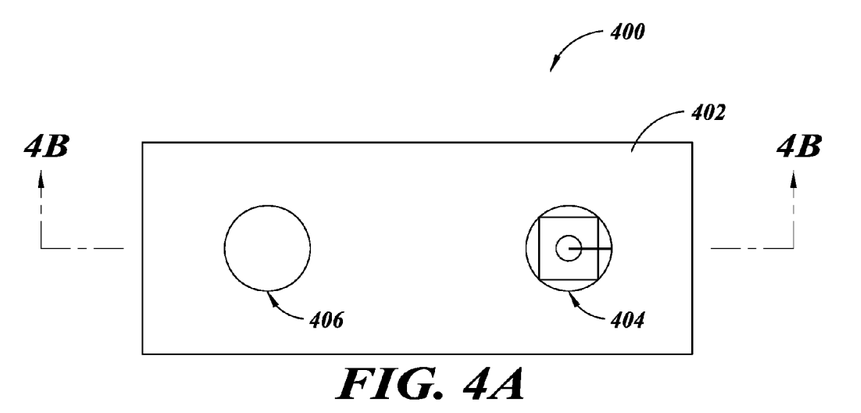
FIG. 4A is a top view of a proximity sensor, according to one embodiment.
Figure 4B:
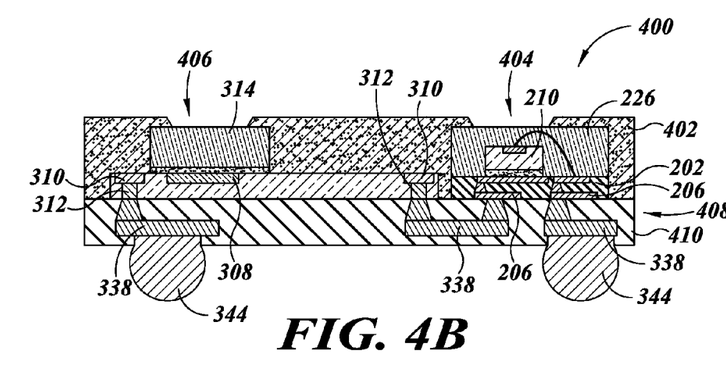
FIG. 4B is a cross-sectional view of the proximity sensor shown in FIG. 4A.

With reference to FIGS. 3L, 4A, and 4B, the semiconductor assembly 300 is then sawed or otherwise separated to form a plurality of proximity sensors 400. For example, the blade of a saw is placed on a surface of the semiconductor assembly 300 at the location 346 and then moved downwardly until the blade passes through at least the second dielectric layer 340, the first dielectric layer 332, and the encapsulating layer 322. Additionally, the second carrier 328 and the second adhesion layer 330 are separated from the encapsulating layer 322. A solvent such as water, for example, may be used to cause the second adhesion layer 330 to separate from the encapsulating layer 322.

FIG. 4A is a top plan view of the proximity sensor 400. The proximity sensor 400 includes a cover 402 formed from the encapsulating layer 322. The cover 402 has a first aperture 404 and a second a second aperture 406 therein formed from one of the first apertures 324 and one of the second apertures 326, respectively.

FIG. 4B is a cross-sectional view of the proximity sensor 400 along the line 4B-4B shown in FIG. 4A. The proximity sensor 400 includes a redistribution layer 408. The redistribution layer 408 includes a substrate 410 formed from the first dielectric layer 332 and the second dielectric layer 340. An upper surface of the substrate 410 includes portions of the contact pads 338. Two of the portions of the contact pads 338 are in electrical communication with respective electrical connectors 312 that extend from the lower surface of the semiconductor die 306 to the contact pad 310. Two of the portions of the contact pads 338 are connected to respective contact pads 206 on the lower surface of the printed circuit board substrate 202 of the light emitting assembly 224. The contact pads 338 form electrical connections between a first one of the electrical connectors 312 and a first one of the solder bumps 344, between a first one of the contact pads 206 and a second one of the solder bumps 344, and between a second one of the electrical connectors 312 and a second one of the contact pads 206.

Because the cover 402 is formed from an opaque material, the cover 402 prevents external light from reaching the sensor area 308 of the semiconductor die 306. Additionally, the cover 402 prevents light emitted from the light emitting device 210, which does not exit the proximity sensor 400 through the first aperture 404 and reenter the proximity sensor through the second aperture 406, from reaching the sensor area 308 of the semiconductor die 306.

During operation of the proximity sensor 400, electrical power is provided to the proximity sensor 400 through one or more of the solder bumps 344 on the lower surface of the substrate 308. The electrical power may be supplied to the semiconductor die 306 via one or more of the solder bumps 344 connected to one of the electrical connectors 312 that is connected to one of the contact pads 310 on the upper surface of the semiconductor die 306. A common reference potential (e.g., ground) may be provided to the proximity sensor 400 through one or more of the solder bumps 344 on the lower surface of the substrate 408. The common reference potential may be supplied to the semiconductor die 306 via one or more of the solder bumps 344 connected to one of the contact pads 310 on the upper surface of the semiconductor die 306.

Additionally, the electrical power and/or the common reference potential may be supplied to the light emitting assembly 224 via respective contact pads 206 on the lower surface of the printed circuit board substrate 202 of the light emitting assembly 224. The semiconductor die 306 includes a driver that controls operation of the light emitting assembly 224. The semiconductor die 306 provide a control signal and/or electrical power to the light emitting assembly 224 via one of the contact pads 338 connected to one of the electrical connectors 312, which is connected to one of the contact pads 310 on the upper surface of the semiconductor die 306, and also connected to one of the contact pads 206 on the lower surface of the printed circuit board substrate 202 of the light emitting assembly 224.

The light emitting device 224 emits light through the lens 226 and the first aperture 404 in the cover 402. Light that is reflected by an object in the vicinity of the proximity sensor 400 may enter the second aperture 406 in the cover 402, pass through the lens 314 and the transparent adhesive material 316, and impact the sensor area 308 of the semiconductor die 306. The semiconductor die 306 outputs one or more signals that are indicative of or proportional to the magnitude of the intensity of the light that impacts the light emitting area 308, from one or more of the contact pads 310 on the upper surface of the semiconductor die 306.

The proximity sensor 400 may provide data or control signals from one or more of the solder bumps 344 on the lower surface of the substrate 408. Those solder bumps 344 are connected by one or more of the contact pads 338 and one or more of the electrical connectors 312 to one or more of the contact pads 310 on the upper surface of the semiconductor die 306.

In one embodiment, a conventional, additional lens (not shown) is attached to the upper surface of the lens 226 using a conventional transparent adhesive material (not shown). The additional lens and/or the transparent adhesive material may enable only light in the infrared spectrum, for example, to pass therethrough. During fabrication of such an embodiment, masks (not shown) are placed over at least part of the upper surfaces of the lens 314 and the additional lens. An encapsulation layer that forms the cover 402 is placed on exposed portions of the upper surface of the printed circuit board substrate 408 and at least part of the upper and side surfaces each of the semiconductor die 606, the lens 314, and the additional lens.

Figure 5:
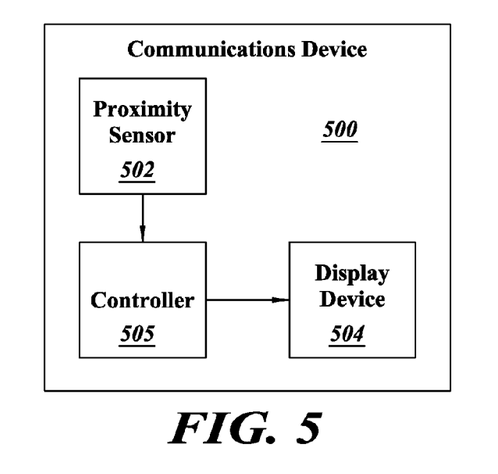
FIG. 5 is a block diagram of a communication device, according to one embodiment.

FIG. 5 is a block diagram of a communication device 500, according to one embodiment. The communication device 500 includes a proximity sensor 502, a controller 504, and a display device 506. In one embodiment, the communication device 500 is a cellular telephone, the proximity sensor 502 is the proximity sensor 400 shown in FIGS. 4A and 4B, and the display device 506 is a touchscreen device. If the proximity sensor 502 is not near the body of a user, for example, the proximity sensor 502 outputs to the controller 504 a first signal indicating that little, if any, light output from the proximity sensor 502 has been reflected from the user's body and returned to the proximity sensor 502. When the controller 504 receives the first signal from the proximity sensor 502, the controller 504 provides to the display device 506 a first control signal that enables the display device 506 and/or causes a back light of the display device 506 to output a predetermined maximum amount of light.

The proximity sensor 502 may be located near a speaker (not shown) of the communication device 500. If the proximity sensor 502 is positioned near the user's body (e.g., the user's ear) the proximity sensor 502 outputs to the controller 504 a second signal indicating that at least a predetermined amount of light output from the proximity sensor 502 has been reflected from the user's body and returned to the proximity sensor 502. When the controller 504 receives the second signal from the proximity sensor 502, the controller 504 provides to the display device 506 a second control signal that disables the display device 506 and/or causes the back light of the display device 506 to output a predetermined minimum amount of light. Accordingly, the proximity sensor 502 may be used to reduce power consumption of the communications device 500.

Figure 6A:
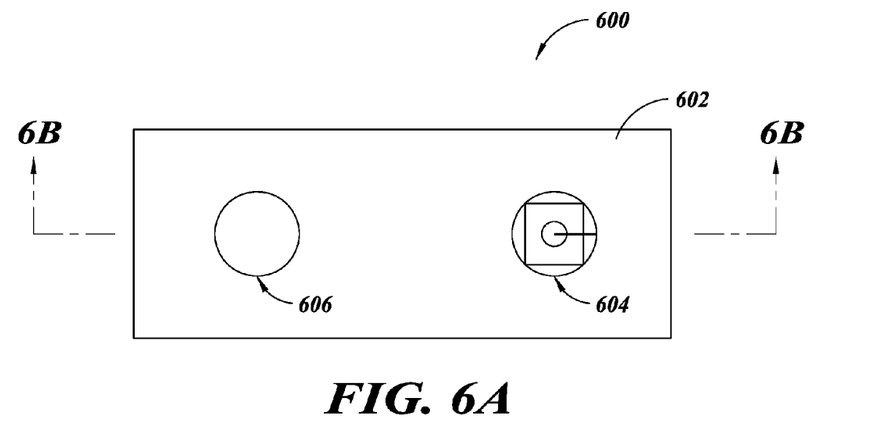
FIG. 6A is a top plan view of a proximity sensor, according to one embodiment.
Figure 6B:
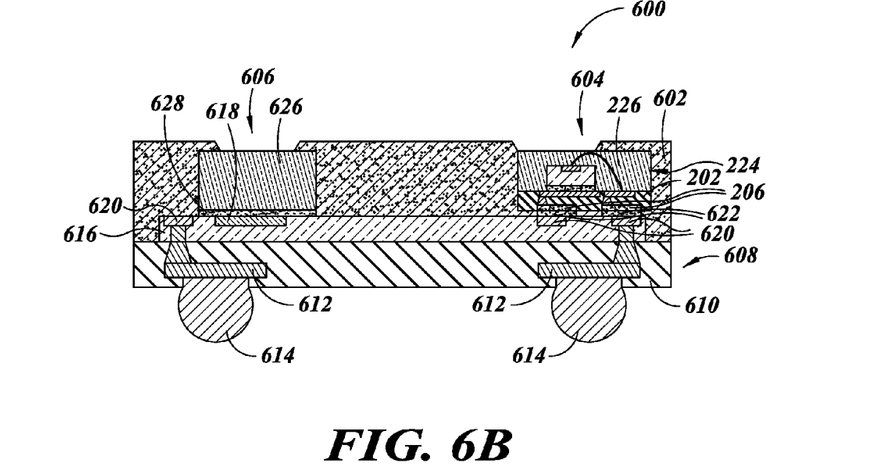
FIG. 6B is a cross-sectional view of the proximity sensor shown in FIG. 6A.

FIG. 6A is a top plan view of a proximity sensor 600, according to one embodiment. FIG. 6B is a cross-sectional view of the proximity sensor 600 take along the line 6B-6B shown in FIG. 6A. The proximity sensor 600 is similar to the proximity sensor 400 shown in FIGS. 4A and 4B, except that the light emitting assembly is mounted on the semiconductor die, as explained in detail below.

The proximity sensor 600 includes a molded cover 602 having a first aperture 604 and a second a second aperture 606 formed therein. The proximity sensor 600 also includes a redistribution layer 608 that includes a substrate 610. An upper surface of the substrate 610 includes portions of contact pads 612. A lower surface of the printed circuit board substrate 608 includes a plurality of solder bumps 614, each of which is in electrical communication with a respective one of the contact pads 612.

A conventional semiconductor die 616 is disposed on the upper surface of the printed circuit board substrate 608. An upper surface of the semiconductor die 616 includes a sensor area 618 and a plurality of contact pads 620. The proximity sensor 600 also includes the light emitting assembly 224 described above. A conventional conductive adhesive material 622 forms an electrical connection between each of the contact pads 206 on the lower surface of the printed circuit board substrate 202 of the light emitting assembly 224 and a respective one of the contact pads 620 on the upper surface of the semiconductor die 616.

A conventional lens 626 is disposed over a sensor area 618 of the semiconductor die 616. A conventional transparent adhesive material 628 secures the lens 626 to the semiconductor die 616. Each of the lenses 626 and/or the transparent adhesive material 628 may enable most, if not all, of the light incident thereon to pass therethrough. For example, the lenses 626 and/or the transparent adhesive material 628 may enable at least 85% of the light in the visible spectrum or light in the infrared spectrum that is incident on the lenses 626 and/or the transparent adhesive material 628 to pass therethrough. Additionally or alternatively, the lenses 626 and/or the transparent adhesive material 628 may act as a filter that prevents predetermined wavelengths of light from passing therethrough. For example, the lenses 626 and/or the transparent adhesive material 628 may prevent light in the visible spectrum or light in the infrared spectrum that is incident thereon from passing therethrough.

During fabrication of the proximity sensor 600, masks (not shown) are placed over at least part of the upper surfaces of the lens 626 and the lens 226. An encapsulation layer that forms the cover 602 is placed on exposed portions of the upper surface of the printed circuit board substrate 608 and at least part of the upper and side surfaces each of the semiconductor die 616, the wire 624, the lens 626, and the light emitting assembly 224.

Figure 7A:
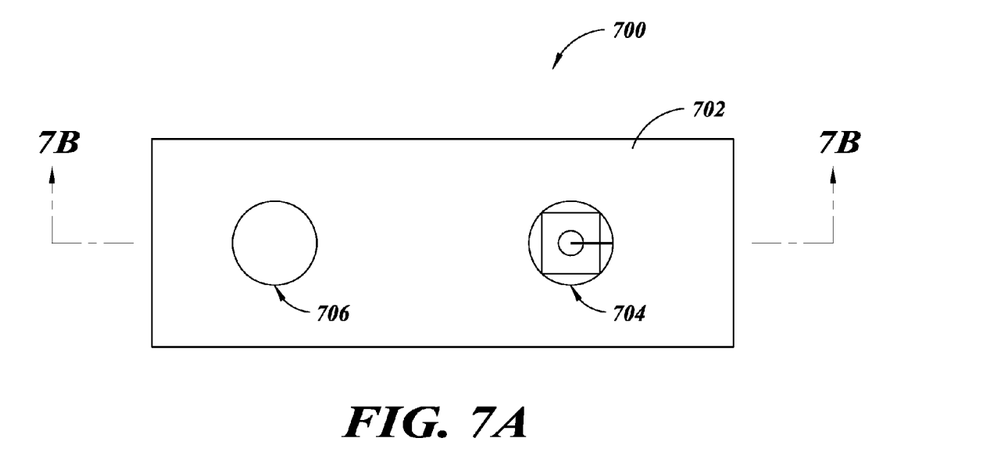
FIG. 7A is a top plan view of a proximity sensor, according to one embodiment.
Figure 7B:
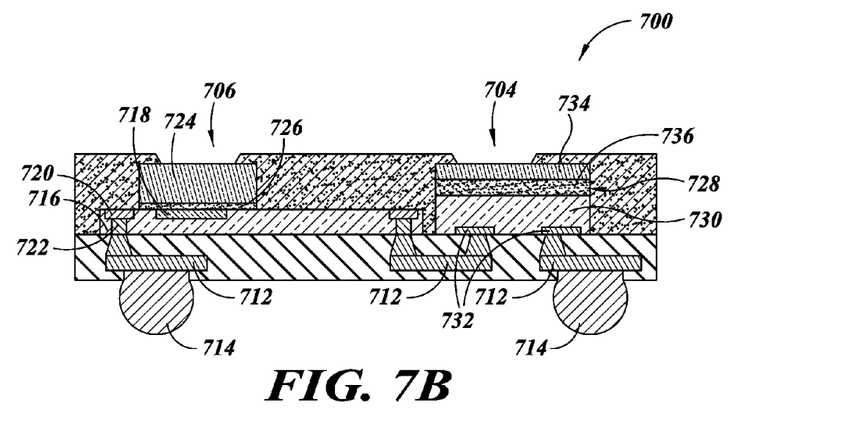
FIG. 7B is a cross-sectional view of the proximity sensor shown in FIG. 7A.

FIG. 7A is a top plan view of a proximity sensor 700, according to one embodiment. FIG. 7B is a cross-sectional view of the proximity sensor 700 along the line 7B-7B shown in FIG. 7A. The proximity sensor 700 is similar to the proximity sensor 400 shown in FIGS. 4A and 4B, except that the light emitting assembly does not include a printed circuit board substrate and the light emitting device includes a plurality of contact pads on a lower surface thereof, as explained in detail below.

The proximity sensor 700 includes a cover 702 that has a first aperture 704 and a second a second aperture 706 formed therein. The cover 702 is formed from a conventional material that does not transmit light therethrough. For example, the cover 702 may be formed from a black material.

The proximity sensor 700 includes a redistribution layer 708 that includes a substrate 710. An upper surface of the substrate 710 includes portions of contact pads 712. A lower surface of the printed circuit board substrate 710 includes a plurality of solder bumps 714, each of which is in electrical communication with a respective one of the contact pads 712.

A conventional semiconductor die 716 is disposed on the upper surface of the substrate 710. The semiconductor die 716 includes a sensor area 718 and a plurality of contact pads 720 on an upper surface of the semiconductor die 716. A plurality of electrical connectors 722 is formed in the semiconductor die 716 from a conventional, electrically conductive material. Each electrical connector 722 is in electrical communication with one of the contact pads 720 on the upper surface of the semiconductor die 716. Additionally, each electrical connector 722 extends from one of the contact pads 720 through the semiconductor die 716 to a lower surface thereof and is electrically coupled to one of the contact pads 712 included in the substrate 710.

A conventional lens 724 is disposed over the sensor area 718 of the semiconductor die 716. A conventional transparent adhesive material 726 secures the lens 724 to the semiconductor die 716.

The proximity sensor 700 also includes a light emitting assembly 728. The light emitting assembly 728 includes a conventional light emitting device 730. A lower surface of the light emitting device 730 includes a plurality of contact pads 732. Each of the contact pads 732 is in electrical communication with a respective one of the contact pads 712 on the substrate 710. A conventional lens 734 is disposed over a light emitting area of the light emitting device 730. A conventional transparent adhesive material 736 secures the lens 734 to the light emitting device 730.

The lens 724, the transparent adhesive material 726, the lens 734 and/or the transparent adhesive material 736 may enable most, if not all, of the light incident thereon to pass therethrough. For example, the lens 724, the transparent adhesive material 726, the lens 734 and/or the transparent adhesive material 736 may enable at least 85% of the light in the visible spectrum or light in the infrared spectrum that is incident thereon to pass therethrough. Additionally or alternatively, the lens 724, the transparent adhesive material 726, the lens 734 and/or the transparent adhesive material 736 may act as a filter that prevents predetermined wavelengths of light from passing therethrough. For example, the lens 724, the transparent adhesive material 726, the lens 734 and/or the transparent adhesive material 736 may prevent light in the visible spectrum or light in the infrared spectrum that is incident thereon from passing therethrough.

During fabrication of the proximity sensor 700, masks (not shown) are placed over at least part of the upper surfaces of the lens 724 and the lens 734. An encapsulation layer that forms the cover 702 is placed on exposed portions of the upper surface of the substrate 710 and at least part of the upper and side surfaces each of the semiconductor die 716, the lens 724, and the lens 734, and on the side surfaces of the light emitting assembly 728.

Figure 8A:
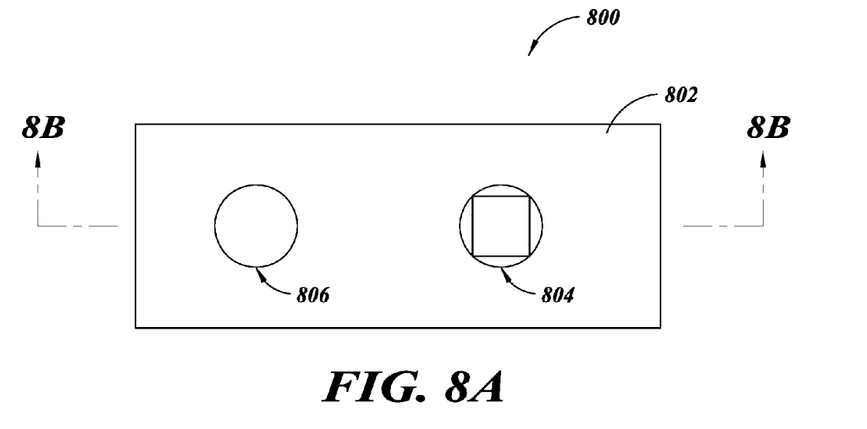
FIG. 8A is a top plan view of a proximity sensor, according to one embodiment.
Figure 8B:
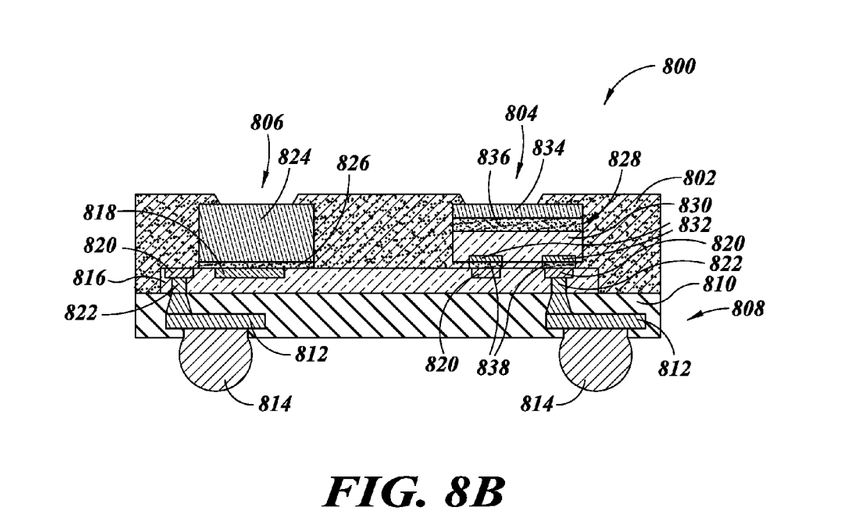
FIG. 8B is a cross-sectional view of the proximity sensor shown in FIG. 8A.

FIG. 8A is a top plan view of a proximity sensor 800, according to one embodiment. FIG. 8B is a cross-sectional view of the proximity sensor 800 along the line 8B-8B shown in FIG. 8A. The proximity sensor 800 is similar to the proximity sensor 700 shown in FIGS. 7A and 7B, except that the light emitting assembly is mounted on the semiconductor die, as explained in detail below.

The proximity sensor 800 includes a cover 802 that has a first aperture 804 and a second a second aperture 806 formed therein. The cover 802 is formed from a conventional material that does not transmit light therethrough. For example, the cover 802 may be formed from a black material.

The proximity sensor 800 includes a redistribution layer 808 that includes a substrate 810. An upper surface of the substrate 810 includes portions of contact pads 812. A lower surface of the printed circuit board substrate 810 includes a plurality of solder bumps 814, each of which is in electrical communication with a respective one of the contact pads 812.

A conventional semiconductor die 816 is disposed on the upper surface of the substrate 810. The semiconductor die 816 includes a sensor area 818 and a plurality of contact pads 820 on an upper surface of the semiconductor die 816. A plurality of electrical connectors 822 is formed in the semiconductor die 816. Each electrical connector 822 is in electrical communication with one of the contact pads 820 on the upper surface of the semiconductor die 816. Additionally, each electrical connector 822 extends from one of the contact pads 820 through the semiconductor die 816 to a lower surface thereof and is electrically coupled to one of the contact pads 812 included in the substrate 810.

A conventional lens 824 is disposed over the sensor area 818 of the semiconductor die 816. A conventional transparent adhesive material 826 secures the lens 824 to the semiconductor die 816.

The proximity sensor 800 also includes a light emitting assembly 828. The light emitting assembly 828 includes a conventional light emitting device 830. A lower surface of the light emitting device 830 includes a plurality of contact pads 832. Each of the contact pads 832 is in electrical communication with a respective one of the contact pads 820 on the upper surface of the semiconductor die 816. A conventional lens 834 is disposed over a light emitting area of the light emitting device 830. A conventional transparent adhesive material 836 secures the lens 834 to the light emitting device 830. Additionally, a conventional conductive adhesive material 838 forms an electrical connection between each of the contact pads 832 on the lower surface of the light emitting device 830 and a respective one of the contact pads 820 on the upper surface of the semiconductor die 816.

The lens 824, the transparent adhesive material 826, the lens 834 and/or the transparent adhesive material 836 may enable most, if not all, of the light incident thereon to pass therethrough. For example, the lens 824, the transparent adhesive material 826, the lens 834 and/or the transparent adhesive material 836 may enable at least 85% of the light in the visible spectrum or light in the infrared spectrum that is incident thereon to pass therethrough. Additionally or alternatively, the lens 824, the transparent adhesive material 826, the lens 834 and/or the transparent adhesive material 836 may act as a filter that prevents predetermined wavelengths of light from passing therethrough. For example, the lens 824, the transparent adhesive material 826, the lens 834 and/or the transparent adhesive material 836 may prevent light in the visible spectrum or light in the infrared spectrum that is incident thereon from passing therethrough.

During fabrication of the proximity sensor 800, masks (not shown) are placed over at least part of the upper surfaces of the lens 824 and the lens 834. An encapsulation layer that forms the cover 802 is placed on the upper surface of the substrate 810 and at least part of the upper and side surfaces each of the semiconductor die 816, the lens 824, and the lens 834, and on the side surfaces of the light emitting assembly 828.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   placing a semiconductor die on a first adhesion layer, the semiconductor die including a sensor area on a first side of the semiconductor die, the first side of the semiconductor die facing away from the first adhesion layer;
   placing a first lens over the sensor area of the semiconductor die;
   placing a light emitting assembly over the first adhesion layer, the light emitting assembly including a light emitting device having a light emitting area and a second lens positioned over the light emitting area, the light emitting area facing away from the first adhesion layer;
   forming an encapsulating layer at least partially on the semiconductor die, the first lens, and the light emitting assembly to form a proximity sensor assembly having a first side, the first side facing away from the first adhesion layer;
   separating the proximity sensor assembly from the first adhesion layer;
   placing the proximity sensor assembly on a second adhesion layer, the first side of proximity sensor assembly facing the second adhesion layer; and
   forming a redistribution layer on a second side of the proximity sensor assembly.

2. The method of claim 1 wherein forming the redistribution layer comprises:
   forming a first dielectric layer on the semiconductor die and the encapsulating layer;
   forming a first plurality of openings in the first dielectric layer, each of the first plurality of openings overlying a respective one of a first plurality of contact pads of the semiconductor die;
   forming a conductive layer over the first dielectric layer and the first plurality of contact pads;
   forming a second plurality of contact pads from the conductive layer;
   forming a second dielectric layer on the first dielectric layer and the second plurality of contact pads;
   forming a second plurality of openings in the first dielectric layer, each of the second plurality of openings overlying a respective one of the second plurality of contact pads; and forming a third plurality of contact pads, each of the third plurality of contact pads being formed on a respective one of the second plurality of contact pads.

3. The method of claim 2 wherein each of the third plurality of contact pads comprises a solder bump.

4. The method of claim 2 wherein forming the redistribution layer comprises:
forming a plurality of electrical connections between the redistribution layer and the semiconductor die, each of the plurality of electrical connections placing one of the first plurality of contact pads in electrical communication with a respective one of the second plurality of contact pads.

5. The method of claim 2 wherein forming the first dielectric layer on the semiconductor die and the encapsulating layer includes forming the first dielectric layer on the light emitting assembly.

6. The method of claim 5, further comprising:
forming a third plurality of openings in the first dielectric layer, each of the third plurality of openings overlying a respective one of a third plurality of contact pads of the light emitting assembly; and
forming the conductive layer on the third plurality of contact pads.

7. The method of claim 1, comprising:
placing the light emitting assembly on the first adhesion layer.

8. The method of claim 1, comprising:
placing the light emitting assembly on the semiconductor die.

9. The method of claim 8, comprising:
forming a plurality of electrical connections between the light emitting assembly and the semiconductor die, each of the plurality of electrical connections place one of a first plurality of contact pads on a lower surface of the light emitting assembly with a respective one of a second plurality of contact pads on an upper surface of the semiconductor die.

10. The method of claim 1, comprising:
placing the light emitting device over a substrate having a first plurality of contact pads on a first side;
forming a plurality of electrical connections between each of the first plurality contact pads and a respective one of a second plurality of contact pads of the light emitting device;
forming a transparent layer over the substrate, the light emitting device, and at least one of the plurality of electrical connections to form the second lens.

11. The method of claim 1, comprising:
removing the proximity sensor assembly from the second adhesion layer.

12. The method of claim 1, comprising:
forming at least one electrical connection between at least one first contact pad on an upper surface of the semiconductor die and at least one second contact pad on a lower surface of the light emitting assembly.

13. A device, comprising:
a semiconductor die including a sensor area on a first surface of the semiconductor die and a first plurality of contact pads on the first surface of the semiconductor die;
a redistribution layer including a second plurality of contact pads on a first side of the redistribution layer, the semiconductor die overlying the redistribution layer;
a first plurality of electrical connectors placing each of the first plurality of contact pads in electrical communication with a respective one of the second plurality of contact pads;
a first lens positioned over the sensor area of the semiconductor die;
a light emitting assembly including a light emitting device having a light emitting area, a second lens positioned over the light emitting area, and a third plurality of contact pads overlying the redistribution layer, the light emitting assembly being in electrical communication with the redistribution layer and the semiconductor die; and
an encapsulating layer positioned on the redistribution layer and at least partially encapsulating the semiconductor die, the first lens, and the light emitting assembly.

14. The device of claim 13 wherein each of the first plurality of electrical connectors extends from a respective one of the first plurality of contact pads through the semiconductor die and the redistribution layer to a respective one of the second plurality of contact pads.

15. The device of claim 13 wherein each of the first plurality of contact pads is positioned over a respective one of the second plurality of contact pads.

16. The device of claim 13 wherein one of the second plurality of contact pads is in electrical communication with one of the first plurality of contact pads and one of the third plurality of contact pads.

17. The device of claim 13 wherein the light emitting assembly comprises:
a substrate, including:
the third plurality of contact pads positioned on a first side of the substrate,
a fourth plurality of contact pads positioned on a second side of the substrate, and
a plurality of conductive traces, each extending in the substrate and placing two or more of the contact pads of the third and fourth pluralities of contact pads in electrical communication,
a fifth plurality of contact pads; and
a second plurality of electrical connectors placing each of the fourth plurality of contact pads in electrical communication with a respective one of the fifth plurality of contact pads.

18. The device of claim 17 wherein the second lens is positioned on at least one of the second plurality of electrical connectors.

19. The device of claim 13 wherein the light emitting assembly is positioned over the semiconductor die.

20. The device of claim 13 further comprising a fourth plurality of contact pads, each of the fourth plurality of contact pads in electrical communication with a respective one of the second plurality of contact pads.

21. The device of claim 20 wherein each of the fourth plurality of contact pads is a solder bump.

* * * * *